United States Patent [19]

Stewart

[11] 4,173,075
[45] Nov. 6, 1979

[54] ENGRAVER'S TEMPLATE

[75] Inventor: John V. Stewart, Watchung, N.J.

[73] Assignee: Swiss Aluminium Ltd., Chippis, Switzerland

[21] Appl. No.: 869,664

[22] Filed: Jan. 16, 1978

Related U.S. Application Data

[62] Division of Ser. No. 748,428, Dec. 8, 1976, Pat. No. 4,139,386.

[51] Int. Cl.$^2$ .............................................. B43L 13/00
[52] U.S. Cl. .................................. 33/23 K; 33/174 G; 156/665
[58] Field of Search .............. 33/23 H, 23 K, 174 B, 33/174 G; 101/128.2, 128.3; 156/652, 653, 665, 667, 668, 905

[56] References Cited

U.S. PATENT DOCUMENTS

| 2,731,333 | 1/1956 | Ko et al. | 156/652 |
| 2,977,227 | 3/1961 | De Maria | 156/905 |
| 3,089,800 | 5/1963 | Colfer et al. | 156/655 |
| 3,139,003 | 6/1964 | Magor | 33/174 G |
| 3,393,453 | 7/1968 | Stoneman | 33/23 H |
| 3,720,143 | 3/1973 | Hashimoto et al. | 156/655 |
| 4,030,967 | 6/1977 | Ingrey et al. | 156/652 |

Primary Examiner—Richard R. Stearns
Attorney, Agent, or Firm—Robert H. Bachman

[57] ABSTRACT

An engravers template having a desired pattern therein with engraved portions and raised portions. An aluminum sheet is provided having an aluminum oxide layer on one side and a plastic layer on the opposite side. The desired engraved pattern is etched through the oxide layer and through the aluminum sheet.

8 Claims, 10 Drawing Figures

ENGRAVER'S TEMPLATE

This is a Division, of application Ser. No. 748,428, filed Dec. 8, 1976, now U.S. Pat. No. 4,139,386, issued Feb. 13, 1979.

BACKGROUND OF THE INVENTION

The present invention concerns an engravers template having graphic patterns, such as an inscription or an artistic design, on a substrate covered with a light-sensitive plastic layer, in particular on an oxidized aluminum sheet adhered to a plastic support film whereby the substrate is illuminated through a superimposed master pattern which allows ultraviolet (UV) light through its light areas.

Mechanical engraving is normally accomplished by freehand guidance of the engraving head by a highly skilled craftsman or by using a pantograph to follow a master pattern. The freehand guidance method is only used in certain highly specialized situations, while the pantograph is used extensively.

The master pattern or template can be prepared by a variety of methods. Conventional methods for producing the template are subject to one or more disadvantages. For example, a previously engraved part can be used to prepare the template; however, the copy from the previously engraved part must be made the same size as the previously engraved part so that imperfections cannot be easily masked. Alternatively, one can utilize brass font characters; however, this procedure is limited to standard letters, figures and symbols and is not useable for intricate designs. An engraved brass or plastic template may be used to prepare the master pattern or template; however, this method is expensive and generally the engraved brass or plastic template must be made by an outside specialist. A still further alternative is to use a cardboard, plastic or wood cutout; however, this method is useable only for simple shapes and in addition tends to be difficult to use.

Thus, it can be seen that it is difficult to obtain engravers templates which are inexpensive to prepare and which may be prepared by the small engraving shop so that they are useable for a wide variety of situations, including the preparation of intricate designs.

Accordingly, it is a principal object of the present invention to provide a convenient and inexpensive method for obtaining an engravers template which is easily used and which is suitable for preparing intricate designs.

It is a still further object of the present invention to provide an improved engravers template as aforesaid.

Further objects and advantages of the present invention will appear hereinbelow.

SUMMARY OF THE INVENTION

In accordance with the present invention, it has now been found that the foregoing objects and advantages may be readily obtained. The improved engravers template of the present invention has a desired pattern therein with engraved portions and raised portions. The template comprises a metal sheet, in particular an aluminum sheet having an aluminum oxide layer on one side and a plastic layer on the opposite side, wherein the desired engraved pattern is etched through the oxide layer and through the aluminum sheet. The aforesaid engravers template is prepared by the following process:

(a) providing a composite sheet having a plastic layer bonded to one side of a metal sheet, in particular an aluminum sheet, with the aluminum or metal sheet having an oxide layer on the opposite side thereof;

(b) covering the oxide layer with a photo resist layer (PR);

(c) applying a positive transparency of the desired pattern to the surface of said PR;

(d) exposing the PR to UV light through the positive transparency to harden the PR where the UV light passes through the positive transparency and leave the PR unhardened where the UV light does not pass through the positive transparency;

(e) developing the PR layer to remove the unexposed or unhardened areas of the PR layer from the surface of the oxide layer;

(f) first etching away the oxide layer in the areas where the PR layer has been removed; and (g) deep etching the aluminum sheet under the etched oxide layer to form the desired engraved pattern.

Preferably, two (2) metal or aluminum sheets are bonded to both sides of the plastic layer, with the desired pattern being etched in one sheet only. Normally, the second metal or aluminum sheet also has an oxide layer thereon and is protected with a readily removable plastic layer so that the etching procedure will not damage the second sheet and so that the readily removable plastic layer may subsequently be removed after the etching steps. The second metal or aluminum layer provides the advantage of additional strengthening for the composite so that said composite will not buckle during the etching procedure. In addition, it is preferred to remove the hardened PR layer after the deep etching procedure.

DETAILED DESCRIPTION OF THE PREFERRED EMBODIMENTS

Figure 1:
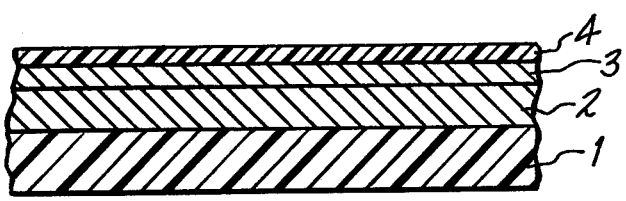
FIG. 1 is a cross section through a composite of the present invention showing the PR applied to the oxide layer.

It is known to produce printed circuits or the like by the use of a layer of a light-sensitive plastic or a photo resist layer (PR) as described in U.S. Pat. No. 3,973,847. In accordance with this known process a PR layer is placed on a metal sheet, a master pattern placed on the composite and exposed to UV light which causes hardening of the PR under the transparent parts of the master pattern, the non-illuminated parts of the PR dissolved off and the metal under the non-illuminated portions etched away. This procedure has found extensive application in the electrochemical industry as well as in other areas; however, this procedure has not been utilized in the preparation of engravers templates such as described above.

In accordance with the process of the present invention a composite is provided having bottom layer 1 of a plastic material which is unaffected by the etching procedure, such as polyethylene, polyvinyl chloride or a light, etch proof and heat resistant polyester generally. The thickness of plastic layer 1 will vary from about 0.01 to 1.0". Aluminum sheet 2 covers plastic layer 1 and is adhered thereto by means of an adhesive (not shown). As indicated hereinabove, the metal sheet is generally aluminum and the oxide layer generally aluminum oxide. Naturally, other metals can be used for one or both of the metal components, such as magnesium or copper, for example. The aluminum sheet 2 is generally of sufficient thickness to provide the desired depth for an engravers template, that is, the aluminum layer should have a thickness of from about 0.005 to 0.20". An aluminum oxide layer 3 is carried by the aluminum sheet 2, generally formed by the known process of anodizing. The oxide layer should have a thickness of from about 0.0004 to 0.001". On the aluminum oxide layer 3 there is a layer 4 of the light-sensitive plastic, a so-called PR layer (photo resist layer). This layer should have a thickness of from about 0.0001 to 0.005", applied either in liquid or dry film form. The plastic of this PR layer has the property in the case of the so-called negative-positive process of hardening when exposed to UV light.

If desired, the aluminum oxide layer 3 can be colored to provide a colored contrast and/or the support film 1 can if desired have a contrasting color. The support film 1 can also be transparent.

Figure 2:
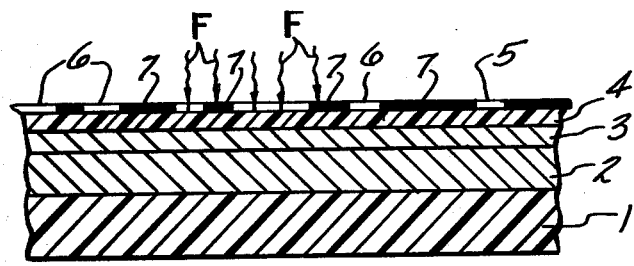
FIGS. 2, 3, 4, 5 and 6 are cross-sectional views similar to FIG. 1 showing the composite of the present invention at the various stages of producing the engravers template of the present invention.

FIG. 2 shows the light exposure stage of producing a pattern on the composite of the present invention. In this figure a master pattern, for example, in the form of a film negative 5, is positioned on the PR layer. The pattern has areas 6 which allow light through and other areas 7, shown dark in the drawing, which do not allow light through. The pattern is then exposed to UV light travelling in the direction of the arrows F. The light beams are approximately parallel as they impinge on the pattern. On the light transparent area 6, the pattern allows the light through to the PR layer which then hardens in these places. The PR layer under the non-transparent layers 7 remains unchanged or unhardened.

Figure 3:
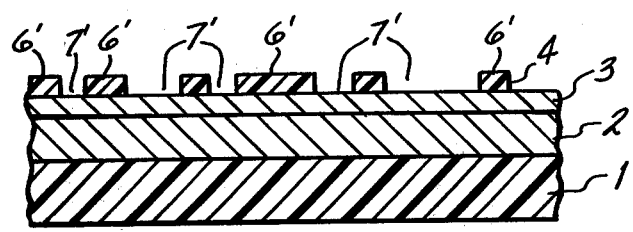

FIG. 3 shows the composite after the development step. The composite is contacted with a developer designed for use with the particular photo resist, for example, 70–80 seconds with a solution which is 90% by volume 1,1,1-trichloroethane and 10% by volume trichloroethylene, which removes those areas of the PR layer which were under the dark places 7 in FIG. 2, i.e., in the unhardened places, so that hollows 7' are produced therein. On the other hand, those illuminated parts 6' of the PR layer, i.e., the hardened places, remain unchanged. In this way, a faintly visible relief image of the master pattern is produced on the composite.

Figure 4:
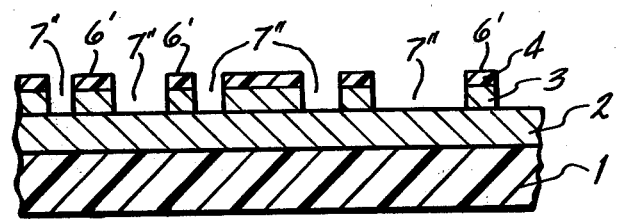
Figure 5:
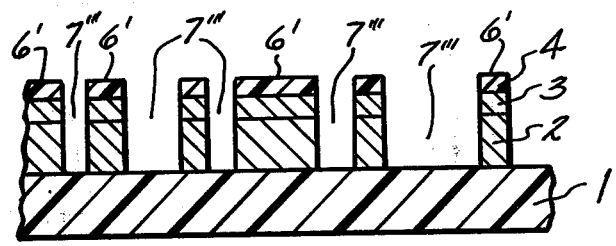

In accordance with the process of the present invention, the composite is deep etched in a step-wise manner in order to obtain an engravers template having the desired depth to be used in an engraving process. The first step is shown in FIG. 4 where the anodic layer only is etched away to provide deeper hollows 7". Generally, a dilute caustic solution is utilized in the first etching treatment, such as a 5–25% and generally a 15% sodium hydroxide solution maintained at an elevated temperature, as from 100° F. to 125° F. and generally at a temperature of 110° F. contacted with the composite for a sufficient period of time to remove the entire anodic layer, for example, from 15 seconds to five minutes. The composite is then rinsed in cold water and subjected to the deep etching procedure to give the product shown in FIG. 5 wherein even deeper hollows 7''' are provided by contacting the pre-etched plate in a more aggressive solution, such as a dilute hydrochloric acid solution, as a 10–30% and generally a 20% hydrochloric acid solution maintained at room or elevated temperature, which may or may not contain additives, such as ferric chloride or sodium lauryl sulfate. A preferred manual procedure is to maintain the deep etching solution at a temperature of between 60° and 80° F. and contact the template with the solution for from 20 to 40 minutes until the groove width will accommodate the stylus. A preferred system using mechanical equipment would be in accordance with particular equipment manufacturers recommendations. The deep etching procedure removes the aluminum layer 2 preferably down to the plastic layer 1. A complete water rinsing and/or neutralization step should then be employed to stop etching action beyond desired levels.

Figure 6:
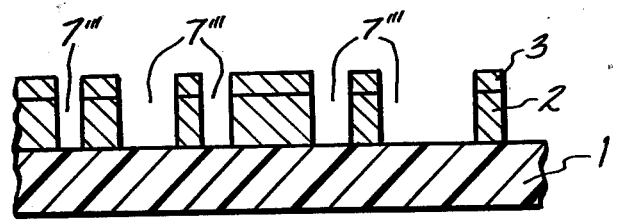
Figure 7:
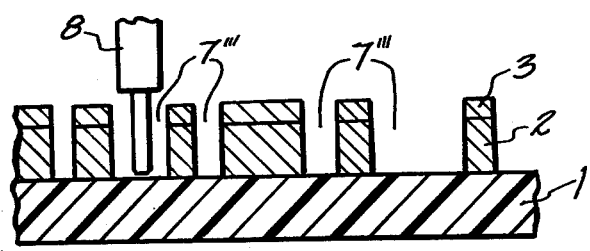
FIG. 7 is a cross-sectional view similar to FIG. 1 showing the use of a stylus in the engravers template of the present invention.

The final step in the process is shown in FIG. 6 which removes the hardened PR layer 6', such as in a stripping tank with an organic solvent. FIG. 7 shows the final article with the stylus 8 shown in the deep hollows 7''''.

After completion of the processing the template should preferably be rinsed well in cold water, followed by immersion in the dilute caustic solution used in the first etching treatment at an elevated temperature for thirty seconds to two minutes to smooth the etched sides of the grooves, remove any anodic layer overhang and any etch products remaining from the deep etching to provide a final template having smooth engraved portions. The final product should preferably then be rinsed well in cold water. The smooth walls of the template of the present invention represent a considerable advantage over machined templates which show score lines.

Figure 8:
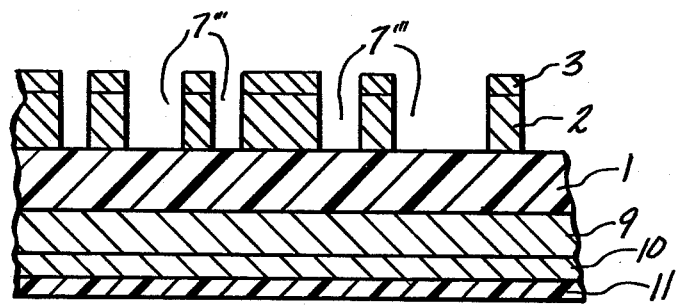
FIG. 8 is an alternate embodiment showing the engravers template of the present invention with two (2) sheets of aluminum bonded to the plastic layer.

The embodiment of FIG. 8 shows the engravers template of the present invention with a second aluminum sheet 9 bonded to the plastic layer having a second aluminum oxide layer 10 thereon and a removable plastic layer 11 protecting the second aluminum oxide layer as discussed above.

Figure 9:
FIGS. 9 and 10 are plan views of alternate embodiments of the present invention.
Figure 10:
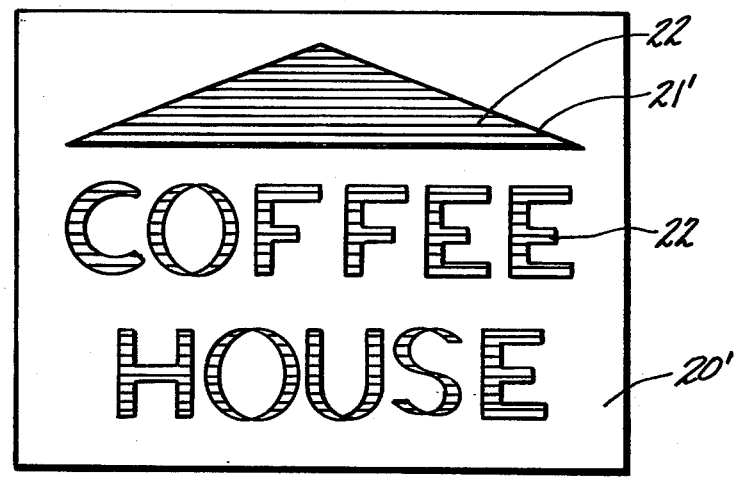

FIG. 9 shows a desired engraving template 20 containing relatively large areas 21 which necessitate randomly moving the stylus throughout the black area in order to completely engrave away the area in the finished piece. In accordance with the present invention the art work can be redrawn to appear as shown in FIG. 10 and template 20' prepared in accordance with the procedure of FIGS. 1–6, including a plurality of spaced grooves 22 of uniform width throughout the engraved areas 21' to establish a fixed path for the stylus to follow. Naturally the spacing between the paths will depend upon the width of the cutter. It can be appreciated that this represents a considerable improvement.

This invention may be embodied in other forms or carried out in other ways without departing from the spirit or essential characteristics thereof. The present embodiment is therefore to be considered as in all respects illustrative and not restrictive, the scope of the invention being indicated by the appended claims, and all changes which come within the meaning and range of equivalency are intended to be embraced therein.

What is claimed is:

1. An engravers template having a desired pattern therein with engraved portions and raised portions comprising a metal sheet having a thickness from about 0.005 to 0.20" and having an oxide layer on one side having a thickness from about 0.0004 to 0.001" and a plastic layer on the opposite side adhered thereto having a thickness from about 0.01 to 1.0", wherein the desired engraved pattern is etched through the oxide layer and through the metal sheet to provide an integral plastic-metal engravers template having said desired pattern etched into the metal sheet and supported by said adhered plastic layer.

2. A template according to claim 1 wherein the metal sheet is aluminum and wherein the oxide layer is aluminum oxide.

3. A template according to claim 2 wherein the desired engraved pattern is etched completely through the aluminum sheet down to the plastic layer.

4. A template according to claim 2 including a second aluminum sheet bonded to the plastic layer, said second aluminum sheet having a second aluminum oxide layer thereon.

5. A template according to claim 4 wherein said second aluminum oxide layer has a readily removable, protective plastic layer thereon.

6. A template according to claim 2 wherein the engraved portions comprise a plurality of spaced grooves of uniform width.

7. A template according to claim 2 wherein the aluminum oxide layer is colored.

8. A template according to claim 7 wherein the plastic layer is colored in a color contrasting to the color of the oxide layer.

* * * * *